(12) United States Patent
O'Neill

(10) Patent No.: US 7,193,541 B2
(45) Date of Patent: Mar. 20, 2007

(54) REPRESENTATION OF SIGN IN ENCODING SCHEME

(75) Inventor: Thomas O'Neill, Mountain View, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 910 days.

(21) Appl. No.: 10/008,638

(22) Filed: Dec. 4, 2001

(65) Prior Publication Data

US 2003/0223646 A1    Dec. 4, 2003

(51) Int. Cl.
*H03M 7/40* (2006.01)

(52) U.S. Cl. .......................... 341/67; 341/65
(58) Field of Classification Search ............ 341/50–70; 708/210
See application file for complete search history.

(56) References Cited

U.S. PATENT DOCUMENTS

| | | | | | |
|---|---|---|---|---|---|
| 3,701,111 | A | * | 10/1972 | Cocke et al. ................. | 341/67 |
| 4,568,916 | A | * | 2/1986 | Bahgat ......................... | 341/67 |
| 4,586,916 | A | * | 5/1986 | Williams et al. .............. | 493/10 |
| 5,021,782 | A | * | 6/1991 | Perron et al. ................. | 341/67 |
| 5,663,725 | A | * | 9/1997 | Jang ............................ | 341/67 |
| 6,014,095 | A | * | 1/2000 | Yokoyama ................... | 341/67 |
| 6,028,541 | A | * | 2/2000 | Levine ......................... | 341/76 |
| 6,043,763 | A | * | 3/2000 | Levine ......................... | 341/51 |
| 6,118,392 | A | * | 9/2000 | Levine ......................... | 341/65 |
| 6,243,496 | B1 | * | 6/2001 | Wilkinson ................... | 382/245 |
| 6,507,293 | B2 | * | 1/2003 | Deeley et al. ................ | 341/67 |
| 6,573,846 | B1 | * | 6/2003 | Trivedi et al. ................ | 341/67 |
| 6,822,586 | B2 | * | 11/2004 | Esbensen ..................... | 341/50 |
| 6,842,124 | B2 | * | 1/2005 | Penna .......................... | 341/67 |
| 6,850,649 | B1 | * | 2/2005 | Malvar ........................ | 382/240 |

* cited by examiner

*Primary Examiner*—Lam T. Mai
(74) *Attorney, Agent, or Firm*—Gunnison, McKay & Hodgson, L.L.P.

(57) ABSTRACT

The present invention is a method for representation of sign in an encoding scheme. An embodiment of the present invention provides a variable bit length binary representation of the absolute value of integer data and then appends a single bit representing the sign of the original integer data. According to one embodiment, the present invention uses the trailing sign bit to specify the sign of the integer being coded. This scheme is much simpler to encode and decode than other schemes that use sign representations for variable-length bit sequences, especially for data that is roughly symmetric about zero, or can be efficiently mapped to this rough symmetry. In another embodiment, if the present invention is used on data sets where there is a most frequently occurring value, the locations of the most frequently recurring value are exhaustively cataloged through some other means, and the variable-length codes are modified to remove the representation of this value. Since the most recurring value is not encoded and decoded individually, the size of the data to be transferred is further reduced.

12 Claims, 4 Drawing Sheets

| Integer | Codeword | Integer | Codeword | Integer | Codeword |
|---|---|---|---|---|---|
| 0 | 1 | +4 | 0001001 | -7 | 0001110 |
| +1 | 011 | -4 | 0001000 | +8 | 000010001 |
| -1 | 010 | +5 | 0001011 | -8 | 000010000 |
| +2 | 00101 | -5 | 0001010 | +9 | 000010011 |
| -2 | 00100 | +6 | 0001101 | -9 | 000010010 |
| +3 | 00111 | -6 | 0001100 | +10 | 000010101 |
| -3 | 00110 | +7 | 0001111 | -10 | 000010100 |

FIGURE 2

| Integer | Codeword | Integer | Codeword | Integer | Codeword |
|---------|----------|---------|----------|---------|----------|
| 0 | 1 | +4 | 0001100 | -7 | 0001011 |
| +1 | 011 | -4 | 0001000 | +8 | 000011000 |
| -1 | 010 | +5 | 0001101 | -8 | 000010000 |
| +2 | 00110 | -5 | 0001001 | +9 | 000011001 |
| -2 | 00100 | +6 | 0001110 | -9 | 000010001 |
| +3 | 00111 | -6 | 0001010 | +10 | 000011010 |
| -3 | 00101 | +7 | 0001111 | -10 | 000010010 |

FIGURE 3

| Integer | Codeword | Integer | Codeword | Integer | Codeword |
|---------|----------|---------|----------|---------|----------|
| 0 | 1 | +4 | 0001001 | -7 | 0001110 |
| +1 | 011 | -4 | 0001000 | +8 | 000010001 |
| -1 | 010 | +5 | 0001011 | -8 | 000010000 |
| +2 | 00101 | -5 | 0001010 | +9 | 000010011 |
| -2 | 00100 | +6 | 0001101 | -9 | 000010010 |
| +3 | 00111 | -6 | 0001100 | +10 | 000010101 |
| -3 | 00110 | +7 | 0001111 | -10 | 000010100 |

FIGURE 4

| Integer value | Entropy code | Integer value | Entropy code |
|---|---|---|---|
| 0 | not represented | +6 | 001100 |
| +1 | 10 | -6 | 001101 |
| -1 | 11 | +7 | 001110 |
| +2 | 0100 | -7 | 001111 |
| -2 | 0101 | +8 | 00010000 |
| +3 | 0110 | -8 | 00010001 |
| -3 | 0111 | +9 | 00010010 |
| +4 | 001000 | -9 | 00010011 |
| -4 | 001001 | +10 | 00010100 |
| +5 | 001010 | -10 | 00010101 |
| -5 | 001011 | | |

REPRESENTATION OF SIGN IN ENCODING SCHEME

BACKGROUND OF THE INVENTION

1. Field of the Invention

The present invention relates primarily to the field of data compression, and in particular to a method for representation of sign in entropy codes.

Portions of the disclosure of this patent document contains material that is subject to copyright protection. The copyright owner has no objection to the facsimile reproduction by anyone of the patent document or the patent disclosure as it appears in the Patent and Trademark Office file or records, but otherwise reserves all rights whatsoever.

2. Background Art

Computer systems are increasingly being used to access, store, and/or process large amounts of data (e.g. audio and video files). It is common to compress data in a computer system so that it can be more easily stored or transmitted. Often the original data and the compressed data has an associated "sign" (positive or negative) that must be associated with the data.

An important aspect of encoding schemes is how they represent the sign of data (often via a "sign bit"). Fixed-width representations of data have two common techniques, namely the two's complement for integers and a leading sign bit for the mantissa of floating point numbers. These two techniques are the standards for the internal representations of integers and floating point numbers in computers. Lossless and lossy JPEG use the one's complement method to represent the sign of variable-width data.

FIG. 1 shows a representation of a lossless JPEG prediction kernel. Here pixel values at pixel positions a, b, and c are available to both the encoder and decoder prior to processing X. The prediction residual for pixel X is defined as: $r=y-X$, where y can be one of the functions mentioned below, and the choice for the y function is defined in the scan header of the compressed data so that both encoder and decoder use the same value. For example, y can be one of:

(A) $y=0$
(B) $y=a$
(C) $y=b$
(D) $y=c$
(E) $y=a+b-c$
(F) $y=a+(b-c)/2$
(G) $y=b+(a-c)/2$
(H) $y=(a+b)/2$

The prediction residual is computed using modulo $2^{16}$ and is expressed as a pair of symbols, namely the category and the magnitude. As is known to those of ordinary skill, the first symbol, namely the category, represents the number of bits needed to encode the magnitude. This symbol is Huffman coded.

For example, if the prediction residual for X is 68, an additional 7 bits are needed to uniquely identify the value 68. This prediction residual is then mapped into a two-tuple (category 7, 7-bit code for 68). The compressed representation for the prediction residual consists of this Huffman codeword for category 7, followed by the 7-bit representation of the magnitude. In general, if the value of the residual is non-negative, the code for the magnitude is its direct binary representation. If on the other hand, the residual is negative, the code for the magnitude is the one's complement of its absolute value. This means that the codeword for negative residuals always start with a zero bit.

Lossy JPEG uses differential coding for the DC coefficients due to the high correlation of DC values among adjacent blocks. For 8-bit-per-pixel data, the DC differentials can take values in the range [−2047, 2047]. This range is divided into 12 size categories, where the i-th category includes all differentials that can be represented by i bits. After a table lookup, each DC differential can be expressed by the pair (size, amplitude), where size is defined as the bits needed to represent the amplitude, and the amplitude is simply the amplitude of the differential. Only the first value of this pair, viz. size is Huffman coded.

Given a DC residual value, its amplitude is calculated as: if the residual is non-negative, the amplitude is its binary representation with size bits of precision. If the residual is negative, the amplitude is the one's complement of its absolute value.

Similarly for 8-bit-per-pixel data, AC coefficients may take any value in the range [−1023, 1023]. This range is divided into 10 size categories, and just like before each AC coefficient can be described by the pair (size, amplitude). Since most AC coefficients are zero after quantization, only the nonzero AC coefficients need to be coded. These coefficients are processed in a zigzag order, which allows for a more efficient operation of the run-length coder. The coder yields the value of the next nonzero AC coefficient and a run, which is the number of zero AC coefficients preceding the present one. Hence, each nonzero AC coefficient can be represented by the pair [run/size, amplitude]. The value of the run/size is Huffman coded, and the value of the amplitude (calculated just like the DC coefficient case) is appended to the code.

Entropy Coding Using Adaptive Prefix Codes

Representing all kinds of data in a numerical form, this scheme encodes both non-negative and negative integers including zero. This scheme has particular application to data sets that are clustered about the zero integer, such as image data sets that have been transformed via a wavelet transform or a discrete cosine transform followed by quantization. Assume the integer to be encoded is denoted by "N", its absolute value as "A" and the number of significant bits in the direct binary representation of A as "L" (this is also the power of 2 encoded by the most significant non-zero bit). The entropy code is constructed as L zero bits, followed by a place-holder 1 bit to mark the end of the zeroes, followed by a value portion of length L. For N>0, the value portion is the direct binary representation of N. For N<0, the value portion is the direct binary representation of A with bit L (the bit encoding $2^L$) cleared. For N=0, L=0 and the value portion has zero length.

The table in FIG. 2 shows the encoding of a few integers, and it can be seen that the codeword for zero (the most frequently occurring integer in image data sets) is the shortest (just one bit), followed by positive and negative one (three bits), and so on. This scheme, when applied to image data, assumes the frequency of data is centered around zero, and so does not require a first pass through the file to determine character frequency like in Huffman's coding scheme.

As illustrated, prior art contains several methods for representing the signs of fixed- and variable-width data. The optimal choice of sign representation depends on the encoding scheme being used and on the nature of the data being encoded. The choice will typically be based on issues like CPU performance and ease of programming. Thus it is useful to introduce a new method of sign representation which, for both encoding and decoding data, is simple to program and requires minimal CPU usage.

SUMMARY OF THE INVENTION

The present invention is a method for representation of sign in an encoding scheme. An embodiment of the present invention provides a variable bit length binary representation of the absolute value of integer data and then appends a single bit representing the sign of the original integer data. For some variable-bit-length coding schemes, this representation of sign is simpler to encode and decode than other sign representations. This is especially true for data that is roughly symmetric about zero, or can be efficiently mapped to this rough symmetry.

In another embodiment, if the present invention is used on data sets where there is a most frequently occurring value, the locations of the most frequently recurring value are cataloged through some other means, and the variable-length codes are modified to remove the representation of this value. Since the most recurring value is not encoded and decoded individually, the CPU requirements for encoding and decoding and/or the size of the data may be further reduced.

BRIEF DESCRIPTION OF THE DRAWINGS

These and other features, aspects and advantages of the present invention will become better understood with regard to the following description, appended claims and accompanying drawings where:

FIG. 2 is a table showing the encoding of a few integers.

FIG. 3 is a table showing the encoding of a few integers according to one embodiment of the present invention.

FIG. 4 is a table showing the encoding of a few integers according to one embodiment of the present invention.

DETAILED DESCRIPTION OF THE INVENTION

Figure 1:
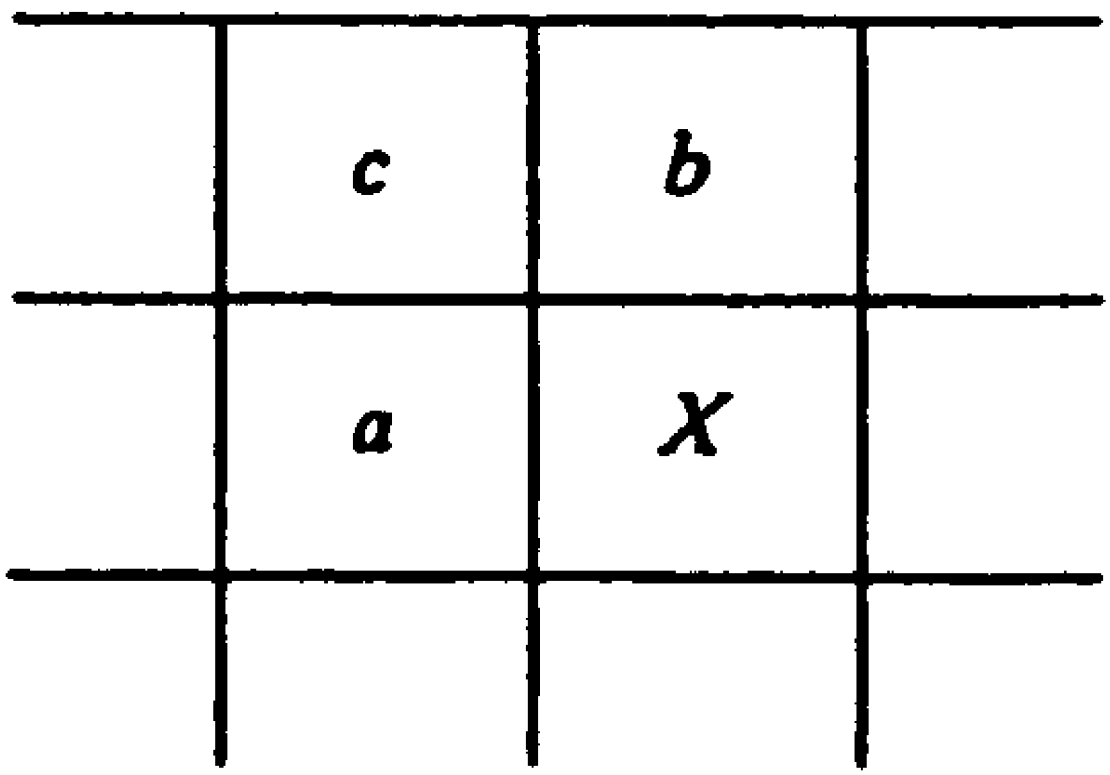
FIG. 1 is a representation of a lossless JPEG prediction kernel.

The invention is a method for representation of sign in encoding schemes. In the following description, numerous specific details are set forth to provide a more thorough description of embodiments of the invention. It will be apparent, however, to one skilled in the art, that the invention may be practiced without these specific details. In other instances, well known features have not been described in detail so as not to obscure the invention.

Given a positive or negative integer value and a unique variable bit length binary representation of the absolute value of the integer, the scheme of the invention provides a unique variable bit length binary representation of the sign and magnitude of the integer. In the invention, a single bit representing the sign of the original integer data is appended to the unique binary representation of the absolute value. There are four natural conventions for the trailing sign bit, depending on whether the negative integers are represented by "1" or "0" and on whether zero—which has undefined sign—is treated as a positive or negative integer. The choice of convention will depend on the details of the scheme used to represent the absolute value of the integer, and on the distribution of the data.

The present invention is simpler in certain cases to encode and decode data than any prior art sign representation for variable-width data. Encoding is accomplished simply by left-shifting by one the unique representation of the absolute value of the integer and, if necessary, by OR-ing in a 1. Decoding of the resulting code word is accomplished by AND-in in a 1 to obtain the sign and by right-shifting the code word by one to obtain the code for the absolute value. (These steps are outlined in detail below for one example entropy code.) The present invention is most useful for encoding data that are roughly symmetrical about the zero integer, or can be efficiently mapped to this rough symmetry. However for fixed-width data, the present invention is no more convenient than the prior art leading sign bit, used for example to represent the sign of the mantissa of floating point numbers.

The present invention may be useful for encoding or decoding schemes that use a lookup table to convert between the integers and the code words. In this case the lookup table is used to record the entropy codes only for the absolute value of the integers, which roughly halves the size of the lookup table (using the absolute value of the encoded integer creates a simple relationship between entropy codes of non-negative and negative integers) at the cost of a small amount of extra computation to handle the sign bit. Even though the savings in RAM space would not affect most applications, the reduction in the size of the lookup table would decrease the number of cache misses. This may lead to an overall increase in the performance of the scheme in spite of the extra operation needed for the sign bit.

In one embodiment of the invention, the present patent relates to co-pending U.S. patent application "Entropy Coding Using Adaptable Prefix Codes," application Ser. No. 09/779,333, filed on Feb. 8, 2001, and assigned to the assignee of this patent application. The above mentioned entropy coding scheme, previously described herein as an adaptive prefix encoding scheme, is compared with the present invention below.

The present invention uses zero bits equal to the number of significant bits in the direct binary representation of the absolute value of the integer to be encoded. Assume the integer to be encoded is denoted by "N", its absolute value as "A" and the number of significant bits in the direct binary representation of A as "L" (this is also the power of 2 encoded by the most significant non-zero bit). The entropy code is constructed as L zero bits, followed by the L significant bits of the direct binary representation of A, followed by a sign bit. The place-holder 1 seen in the old scheme that separates the prefix zeros and the binary representation of the integer to be encoded is no longer necessary in the present invention because bit L of the direct binary representation of A is, by the definition of L, equal to one.

The code for the present invention occupies the same number of bits as the old scheme. This is because the space for the place-holder 1 bit seen in the old scheme is now occupied by the trailing sign bit in the present invention. There are two convenient methods of denoting the trailing sign bit. One method uses 1 to denote all non-negative integers including zero, and 0 to denote all negative integers. Another method uses 1 for all negative integers including zero and 0 for all non-negative integers. Zero is always represented by the 1 sign bit in order to ensure that the initial sequence of zeros, especially in the case where L=0, is terminated by a 1. For reasons explained in further detail below, the first method where 1 is used for all non-negative integers including zero, and 0 is used for all negative integers is used in the examples below. FIG. 3 shows the encoding of a few integers using the present invention. One can notice that the number of bits in the codewords are the same as was found in FIG. 2. The present invention is also simpler and faster to encode as well as decode.

Encode

Assuming that N, A, and L have been already defined (this part of the algorithm is common to both schemes), the encoded value is stored in X. The C program for the old scheme looks like:

```
if (N >= 0)
{
    X = (N | (1 << L)); // 1 << L is shifting 1 to the left L times in binary.
            // Same as doing 2 ^ L.
            // '|' is a bit wise "or", not a logical "or".
}
else // N < 0 case.
{
    X = ((A |(1 << L)) & ( ~ (1 << (L−1)))); // '&' is a bit wise "and", not a
logical
            // "and".
            // '~' is the complementary operator.
}
```

Here the "|(1 <<L)" in the "if" case sets the place-holder 1 bit and the "& ( ~ (1 << (L−1)))" in the "else" case clears the L bit. The C program for the present invention looks like:

```
if (N < 0)
{
    X = A << 1; // A << 1 is shifting the binary value of A to the left one place.
        // Same as multiplying the binary value of A by 2.
}
else // N >= 0 case
{
    X = ((N << 1)|1); // '|' is a bit wise "or", not a logical "or".
}
```

Here the "<<1" makes room for the sign bit, and the "|1" in the "else" case sets it. By tabulating the number of operations in both schemes, one will appreciate the reduced operations in the present invention, especially for negative integers. Tables 2 and 3 show the operations and number of times a value uses the operations in both schemes.

TABLE 2

(old scheme)

| Value | << | \| | & | ~ | subtract |
|---|---|---|---|---|---|
| 0 | 1 | 1 | — | — | — |
| >0 | 1 | 1 | — | — | — |
| <0 | 2 | 1 | 1 | 1 | 1 |

TABLE 3

(present invention)

| Value | << | \| | & | ~ | subtract |
|---|---|---|---|---|---|
| 0 | 1 | 1 | — | — | — |
| >0 | 1 | 1 | — | — | — |
| <0 | 1 | — | — | — | — |

The present invention uses the same type and number of operations as the old scheme to encode both zero and non-negative integers, but uses just $\frac{1}{5}^{th}$ as many type of operations and $\frac{1}{6}^{th}$ number of operations as the old scheme to encode negative integers. This gives the present invention a three folds advantage. Firstly, there is significant savings in the speed of the algorithm due to the reduced number of operations. Secondly, the shifts are by fixed rather than variable amounts, and this could lead to further speed-ups on some architecture/compiler combinations. Thirdly, the C code for the present invention is shorter and easier to read.

Decode

Similar speed-ups and simplifications occur during decoding. Assuming that L has been determined by counting the leading zeros and the 2L+1 bits of the entropy code have been read into integer variable X, the C program code for the old scheme looks like:

```
S = L − 1;
if (X & (1 << S)) // value is >=0. '&' is a bit wise "and", not a logical "and".
{
    N = X;
}
else // value is < 0
{
    N = − (X|(1 << S)); // '|' is a bit wise "or", not a logical "or".
        // '−' is the unary negation operator.
}
    The C program code for the present invention looks like:
if (X & 1) // value is >= 0
{
    N = X << 1;
}
else // value is < 0
```

-continued

```
{
    N = - (X << 1); // '-' is the unary negation operator.
}
```

For values N>=0, the present invention requires one fewer subtraction, but the same number of shifts. For values N<0, the present invention requires one fewer OR function, but the same number of shifts. These shifts are fixed as in the encoding stage rather than variable length. Furthermore, the C code is shorter and easier to read in the present invention. All these factors make the present invention faster and simpler for both encoding and decoding.

Trailing Sign Bit v/s Leading Sign Bit

The old scheme uses the sign bit after the place-holder 1 bit when encoding an integer. Similarly, the present invention places the sign bit after the direct binary representation of A. One could place the sign bit before the sequence of L zeros, but this convention proves to be computationally more expensive for both encoding and decoding. Using the convention of placing a leading sign bit, the encoder would look like:

if(N<0)
    X=A;

else
    X=(N|(1<<(L<<1))); //'|' is a bit wise "or", not a logical "or".

Here "(L<<1)" is used to multiply L by 2, and "|(1<<(L<<1))" sets the 2L+1 bit of X. The code is faster for values N<0, but slower for all values N>=0. For data sets peaked at zero (most data sets that need compression are image data sets that are centered around zero), this method leads to an overall decrease in speed. The problem is worsened during the decoding phase. For example, if the CPU supports a count leading zero instruction, the sign bit has to be first extracted separately from the input bit stream so that the sequence of L zeros start in the most significant bit position of the variable buffering the input stream. This extraction from the input stream adds a significant overhead to the scheme.

Trailing Sign Bit Convention

The examples use the sign bit convention of denoting all non-negative integers including zero with a 1, and all negative integers with a 0. We will now show that this convention requires fewer operations than the alternative (integers<=0 represented with a 1) for data sets that are centered about the zero integer or have the zero integer as the most recurring value. We begin by considering the encoder. Here the computation of A and L is explicitly displayed, and are moved into the if/else construct for efficiency reasons.

if (N<0)

```
{
    A = -N;
    L = Count_significant_bits (A);
    X = A << 1;
}
else     // N >=0 case.
{
    L = Count_significant_bits (N);
    X = ((N << 1)|1); // '|' is a bit wise "or", not a logical "or".
}
```

It should be noted that A is not calculated for values of N>=0, which is a savings of one unary operation. The C code for the other convention (1 for all negative integers including zero, and 0 for all non-negative integers) is described below, and looks like:

```
if (N > 0)
{
    L = Count_significant_bits (N);
    X = N << 1;
}
else     // N <= 0 case.
{
    A = -N;
    L = Count_significant_bits (A);
    X = (A << 1)|1; // '|' is a bit wise "or", not a logical "or".
}
```

This code has the same number of operations for both negative and non-negative integers, however, it requires an additional negation (to determine A) for the zero integer. An analogous conclusion is found in the decoding phase too. Thus it is better to use the first convention where the sign bit for all non-negative integers including zero is denoted by a 1 and all negative integers are denoted by a 0. It should be noted here that for data sets that are centered about the zero integer, it may increase the efficiency if the data are explicitly checked for the zero case at the beginning of the encoding and decoding process. In such a case, it may not matter any longer which convention is used. On the other hand, if the values are skewed towards non-negative values, then it may be more beneficial to use the alternative convention (1 means all negative integers including zero and 0 means all positive integers) because it makes the non-negative case more simpler to encode and decode than the negative case.

Other Advantages of the Present Invention

If the data set is centered about, and highly peaked at zero, or can be efficiently mapped to zero, then the present invention can be combined with U.S. pat. No. 6,522,270 entitled "Method of Coding Frequently Occurring Values" assigned to the assignee of this patent application. Since the locations of the zero values are exhaustively cataloged through some other means in the above mentioned patent, using the present scheme allows the user to eliminate the representation of the zero integer (the most probable value or MPV) for encoding and decoding procedures. In other words, the initial sequence of zeros can be shortened to length L−1 (L is now >=1 since zero is not included), which reduces the length of the coded integers by one. Combining the present scheme with the patent mentioned above, both trailing sign bit methods work equally well for encoding values that are symmetrically distributed about zero.

The present scheme was combined with a video compression algorithm using the discrete cosine transformation and matrix quantization on 8×8 blocks of Y, Cb and Cr pixel values. After quantization, the most frequent coefficient value was zero. To enumerate the position of the zeros, the codec used row-coding bit masks to indicate rows that had zero in all its 8 locations, and a column-coding bit mask at the beginning of each row with one or more non-zero locations. Since non-negative coefficients occurred slightly more than negative coefficients, the second convention where 1 is chosen for all negative integers including zero, and 0 is chosen for all non-negative integers was chosen for the trailing sign bit. FIG. 4 shows the results of the exercise, and one can compare it with FIG. 3 to appreciate a reduction in space for encoding the integer values. This reduction in space is eventually used up by the column-coding bit mask, so the exercise takes the same amount of space as the present invention. Although the compression is unchanged, the encoding and decoding are both accelerated.

Thus, a method for fast representation of sign in entropy codes is described in conjunction with one or more specific embodiments. The invention is defined by the following claims and their full scope of equivalents.

I claim:

1. A method for encoding integer data comprising:
providing a unique variable bit length binary representation of the absolute value of said integer data; and
appending to said unique variable bit length binary representation a single bit representing the sign of said integer data;
wherein said single bit is zero for integer data that is less than or equal to zero.

2. A method for encoding integer data comprising:
providing a unique variable bit length binary representation of the absolute value of said integer data; and
appending to said unique variable bit length binary representation a single bit representing the sign of said integer data;
wherein said single bit is one for integer data that is less than or equal to zero.

3. A method for encoding integer data comprising:
providing a unique variable bit length binary representation of the absolute value of said integer data; and
appending to said unique variable bit length binary representation a single bit representing the sign of said integer data;
wherein said single bit is zero for integer data that is greater than or equal to zero.

4. A method for encoding integer data comprising:
providing a unique variable bit length binary representation of the absolute value of said integer data; and
appending to said unique variable bit length binary representation a single bit representing the sign of said integer data;
wherein said single bit is one for integer data that is greater than or equal to zero.

5. A method for encoding integer data comprising:
providing a unique variable bit length binary representation of the absolute value of said integer data; and
appending to said unique variable bit length binary representation a single bit representing the sign of said integer data;
wherein said unique binary representation comprises a leading portion and a value portion;
further wherein said leading portion encodes the length of said value portion.

6. A method for encoding integer data comprising:
providing a unique variable bit length binary representation of the absolute value of said integer data; and
appending to said unique variable bit length binary representation a single bit representing the sign of said integer data;
wherein said unique binary representation comprises a leading portion and a value portion;
further wherein said leading portion comprises a number of identical bits equal to the number of bits in said value portion.

7. The method of claim 6 wherein said number of identical bits comprises bits having a value of zero.

8. A method for encoding integer data comprising:
providing a unique variable bit length binary representation of the absolute value of said integer data; and
appending to said unique variable bit length binary representation a single bit representing the sign of said integer data;
wherein said unique binary representation comprises a leading portion and a value portion;
further wherein said value portion comprises the significant bits of said absolute value of said integer data written in a binary base system.

9. A method for encoding integer data comprising:
providing a unique variable bit length binary representation of the absolute value of said integer data; and
appending to said unique variable bit length binary representation a single bit representing the sign of said integer data;
wherein said unique binary representation comprises a leading portion and a value portion;
further wherein said leading portion precedes said value portion.

10. A method for encoding integer data comprising:
providing a unique variable bit length binary representation of the absolute value of said integer data; and
appending to said unique variable bit length binary representation a single bit representing the sign of said integer data;
wherein said integer data comprises data from a data set having a most probable value;
further wherein the occurrence of said most probable value is specified separately.

11. A method for encoding integer data comprising:
providing a unique variable bit length binary representation of the absolute value of said integer data; and
appending to said unique variable bit length binary representation a single bit representing the sign of said integer data;
wherein said integer data comprises data from a data set having a most probable value;
further wherein said data set comprises image data.

12. A method for encoding integer data comprising:
providing a unique variable bit length binary representation of the absolute value of said integer data; and
appending to said unique variable bit length binary representation a single bit representing the sign of said integer data wherein:
said integer data is denoted by "N" and has an absolute value binary representation "A" having "L" significant bits;
said unique variable bit length binary representation comprises L zeros followed by A.

* * * * *